United States Patent [19]

Bopp et al.

[11] Patent Number: 4,476,621

[45] Date of Patent: Oct. 16, 1984

[54] PROCESS FOR MAKING TRANSISTORS WITH DOPED OXIDE DENSIFICATION

[75] Inventors: Kenneth C. Bopp, Scottsdale; Judith L. Gooden, Phoenix; Narayan M. Kulkarni, Mesa, all of Ariz.

[73] Assignee: GTE Communications Products Corporation, Phoenix, Ariz.

[21] Appl. No.: 462,739

[22] Filed: Feb. 1, 1983

[51] Int. Cl.³ .......................................... H01L 21/324
[52] U.S. Cl. ...................................... 29/571; 29/578; 148/187; 156/641; 156/644; 427/85
[58] Field of Search .................. 29/571, 578; 148/187; 156/641, 644; 427/85

[56] References Cited

U.S. PATENT DOCUMENTS

| | | | |
|---|---|---|---|
| 3,825,442 | 7/1974 | Moore | 148/187 X |
| 4,028,150 | 6/1977 | Collins et al. | 148/188 X |
| 4,224,089 | 9/1980 | Nishimoto et al. | 148/188 X |
| 4,271,582 | 6/1981 | Shirai et al. | 148/187 |
| 4,273,805 | 6/1981 | Dawson et al. | 148/187 X |
| 4,277,291 | 7/1981 | Cerofolini et al. | 148/188 X |
| 4,295,266 | 10/1981 | Hsu | 29/571 |
| 4,314,857 | 2/1982 | Aitken | 148/187 X |
| 4,348,802 | 9/1982 | Shirato | 29/571 |
| 4,349,584 | 9/1982 | Flatley et al. | 148/187 X |
| 4,371,403 | 2/1983 | Ikubo et al. | 29/571 X |

Primary Examiner—G. Ozaki
Attorney, Agent, or Firm—Russell A. Cannon

[57] ABSTRACT

A method of fabricating CMOS integrated circuits including the ordered steps of: depositing a layer of phosphorus doped silicon oxide; heating the oxide layer at a temperature and duration sufficient to reflow and densify it; forming contact apertures in the oxide layer for exposing source and drain regions of transistors; and cleaning the wafer in an etchant solution for rounding off sharp edges on the oxide layer prior to contact metallization. In a preferred embodiment, all steps between forming contact apertures and through metallization are formed at a temperature that is lower than the temperature that will cause flow of the oxide layer.

18 Claims, 3 Drawing Figures

PROCESS FOR MAKING TRANSISTORS WITH DOPED OXIDE DENSIFICATION

BACKGROUND OF INVENTION

This invention relates to the manufacture of complimentary insulated gate metal oxide on silicon (CMOS) integrated circuits and more particularly to an improved method of obtaining desired edge profiles in contact apertures of the phosphorus doped silicon oxide layer in a CMOS device prior to contact metalization.

In the manufacture of CMOS devices, a layer of phosphorus doped silicon oxide glass is normally deposited over the active elements of the transistors to protect them from contamination and to insulate them from electrically conductive material which is subsequently deposited to provide contacts for electrodes of the transistors. When contact apertures are etched through the glass layer to expose source, drain and gate regions, however, sharp corners are present at the junction of the aperture walls and the top surface of the glass. If the contact material is deposited on the glass at this point, the thickness thereof is reduced at the sharp corners. This nonuniformity in the conductive material limits its current carrying capacity and presents reliability problems with the integrated circuits. In order to overcome this problem, various techniques are employed to round off the sharp edges of the glass at the contact apertures. One technique is to heat the wafer at an elevated temperature which causes the glass to flow and round the edges of the aperture. This can cause phosphorus ions in the glass to migrate onto the source and drain regions and be baked into the semiconductor material, however, creating a series diode or ohmic contact which impairs or degrades the electrical characteristics of the device. If the wafer sits around for a period of time prior to metalization, the practice is to place the wafer in a weak hydrofluoric acid bath of concentration such as 50:1 for an extended time period such as 40 seconds to remove silicon oxide layers that may build up on exposed surfaces. A short hydrofluoric clean is then employed immediately prior to metalization. Another technique is to use a graded glass which is more heavily doped at the top thereof, i.e., away from the substrate, so as to provide less flow adjacent the semiconductor material. This process is expensive and has met with only moderate success. Another technique is to form tapered walls on the contact apertures with a slope-etch process which undercuts the photoresist. This process is difficult to control and may require a larger surface area of a wafer, which is undesirable.

An object of this invention is an improved method of producing electrical contact areas in an integrated circuit device.

DESCRIPTION OF DRAWING

This invention will be more fully understood from the following detailed description of preferred embodiments thereof, reference being had to the accompanying drawing which is not drawn to scale and in which.

DESCRIPTION OF PREFERRED EMBODIMENTS

Figure 1:
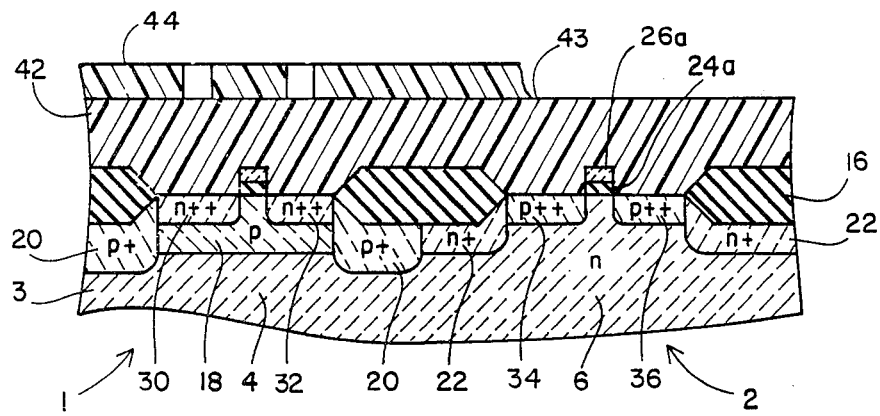
FIG. 1 is a cross-sectional view of a representative portion of a silicon wafer having CMOS transistors fabricated therein.

The process of manufacture and structure of CMOS integrated circuits are described in the U.S. Pat. Nos. 4,277,291, issued July 7, 1981, for "Process For Making CMOS Field-Effect Transistors" by Cerofolino et al.; 4,295,266, issued Oct. 20, 1981, for "Method of Manufacturing Bulk CMOS integrated Circuits" by Hsu; and 4,314,857, issued Feb. 9, 1982 for "Method of Making Integrated CMOS and CTD by Selective Implantation" by Aitken, which are incorporated herein by reference. The integrated circuit structure in FIG. 1 is similar to that in U.S. Pat. No. 4,277,291 and generally comprises n-channel and p-channel transistors 1 and 2 that are formed in a monocrystalline n-type silicon substrate 3 that is the base element of a larger wafer. The n-channel transistor 1 comprises a pair of n++ islands 30 and 32 above a p-doped area 18 of the substrate above the zone 4, the islands 30 and 32 being separated by a step or raised portion of the area 18 on which an insulating gate consisting of an oxide layer and a polycrystalline silicon covering is formed. The p-channel transistor 2 comprises a pair of p+ islands 34 and 36 in zone 6 of the substrate which are spaced apart by a step or raised portion of the substrate on which an insulated gate consisting of an oxide layer 24a and a polycrystalline silicon covering 26a is formed. Adjacent n-channel and p-channel transistors may be separated by field oxide zones 16 or by p+ and n+ guard zones 20 and 22 that are protected by heavy oxide barriers 16. The integrated circuit structure described thus far is substantially the same as that in U.S. Pat. No. 4,277,291.

Prior to forming the layer 42 of glass over the active elements of the transistors to protect them from contamination and insulate them from electrically conductive contact material, the wafer is agitated in a weak hydrofluoric (HF) acid bath of concentration such as 50:1 for a short time interval such as 10 seconds to remove any oxide from the surface of the doped regions such as 30, 32, 34 and 36. The wafer is then rinsed in the deionized water until the resistivity of the latter increases to approximately 14 megohms. A homogenous layer 42 of phosphorus doped silicon oxide glass such as PVX (which is a mixture of $SiO_2$ and $P_2O_5$ with approximately 8% phosphorus by weight) is then deposited on the exposed top surface of the wafer by passing it through a furnace at 400° C. and containing an atmosphere of phosphine ($PH_3$), together with silane ($SiH_4$) and oxygen ($O_2$). These gases react to deposit a layer 42 of glass that is essentially homogenous, with a thickness of approximately 11,000 Angstroms and a phosphorus by weight concentration of approximately 8-9%. Since the deposited glass is of a loose molecular structure that is relatively porous, the wafer is lightly oxidized and then annealed in a nitrogen atmosphere to densify and reflow the glass prior to cutting contact apertures in the layer 42. Depending on the size of the wafer, this densification may be accomplished by preheating the wafer in a 900° C. nitrogen atmosphere for a short time interval, gradually increasing the temperature to 1,000° C., oxidizing it for a short time interval at 1,000° C., and then annealing it in a 1,000° C. nitrogen atmosphere for a long duration of approximately 65 minutes, after which the temperature is ramped back down to 900° C. where the temperature of the wafer fully stablizes in a nitrogen atmosphere. In accordance with one aspect of this invention, the device is never again exposed to a high temperature that is sufficient to reflow the glass. In accordance with another aspect of this invention, the device is not again exposed to a high temperature that is sufficient to reflow the glass. until connection of electrical contacts to the source and drain regions is completed. In a preferred embodiment, subsequent steps are performed at less than approximately 700° C.

Figure 2:
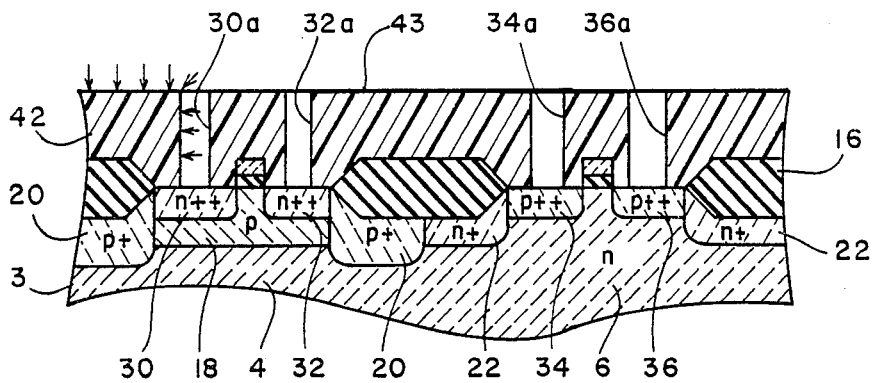
FIGS. 2 and 3 are similar cross-sectional views showing successive steps in an integrated circuit manufacturing process.
Figure 3:
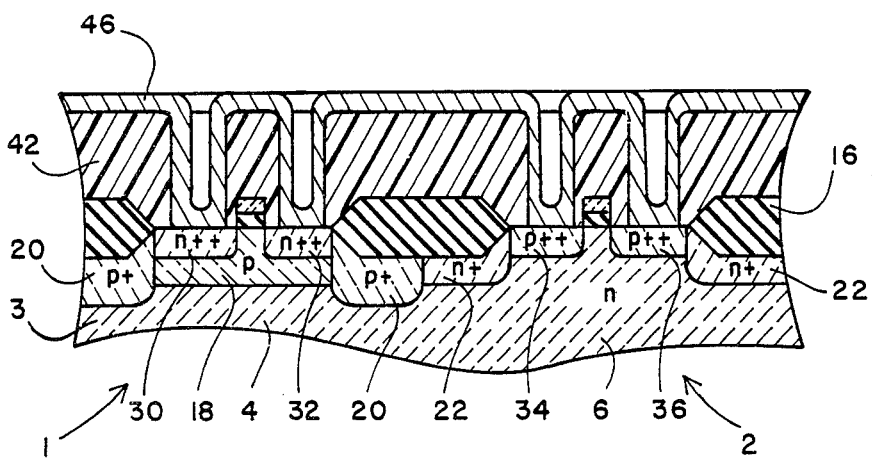

Contact apertures for the source and drain areas are formed in the conventional manner by coating the glass 42 with a layer 44 of photoresist, to remove particular areas thereof. After the photoresist is baked, the wafer is immersed in a buffered oxide etching solution in the conventional manner to form contact apertures designated by the lower case letters "a" which expose associated ones of the source and drain regions 30, 32, 34 and 36, as is shown in FIG. 2 (where the photoresist has been removed from the top surface of the glass). Reference to FIG. 2 reveals that there are sharp corners at the junctions of the top surface 43 of the glass and the walls of the contact apertures.

In accordance with yet another aspect of this invention, the apertured wafer in FIG. 2 is immersed and agitated in a non-etching buffered chemical cleaning solution, which may be a mild solution of sulfuric acid and hydrogen peroxide, for an extended period of time such as 10 minutes for removing any remaining photoresist and insuring a clean surface for metal deposition. This is followed by an extended etch of the exposed surface of the glass for approximately 45 seconds in a concentrated buffered etchant solution such as ammonium hydroxide and hydrofluoric acid in a concentration of 20:1. Since the etchant solution attacks all sides of the sharp edges of the glass at the apertures, as is indicated by the arrows in FIG. 2, these sharp corners are rapidly eaten away and rounded off. The wafer is continuously agitated during etching. This means that removed particles of phosphorus doped glass are maintained in solution at a relatively low ambient temperature so that they tend not to be deposited on the exposed semiconductor surfaces and adversely dope them with phosphorus ions. The etched wafer in FIG. 2 is thoroughly rinsed in deionized water to remove any glass particles in solution from the wafer.

Finally, the wafer is located in a vacuum chamber and a layer 46 of contact metal of pure aluminum is deposited to a thickness of approximately 9500 Angstroms over the exposed surface of the wafer, such as by sputtering or electron beam evaporation. Alternatively, the metal may be an alloy comprising elements such as 98.5% aluminum, 1% silver, and 0.5% copper. The metallized wafer is then annealed for 30 minutes in an atmosphere which is primarily nitrogen, and a small amount of hydrogen, at a temperature of 450° C. The excess metal is removed from the device by coating it with a photoresist in a prescribed contact pattern and placing it in an appropriate etching solution. The wafer is then coated with an appropriate passivation layer of a lightly doped glass which protects the structure from moisture and other types of contamination, prior to again exposing the metal contacts so that they may be bonded to metal pads for electrical connection to terminals of an integrated circuit package.

An acceptable amount of rounding off of the sharp edges of the glass has been found empirically to be that which provides at least a 50% step coverage or thickness of the metal at the rounded edges for conventional metallization. Stated differently, the rounding off is preferably sufficient to provide a thickness of metal at the rounded off edges of the glass that is at least 50% of the thickness of deposited metal elsewhere on the wafer. The process parameters, such as type and concentration of etchant solution, duration time of etching and rinsing, plating time and temperature, etc., for providing this desired rounding off are determined empirically, by trial and error, on various wafers which are then sectioned for measuring the thickness of the deposited metallization layer.

Although this invention is described in relation to preferred embodiments thereof variations and modifications will occur to those skilled in the art. By way of example, the etchant solution for the rounding off operation may be other than buffered, may contain an etchant of other than hydrofluoric acid, may be of different concentrations, and may be utilized for different time durations. The process parameters would then be determined in the manner specified above. Also, the glass 42 may be a graded phosphorus doped glass or may contain different concentrations of phosphorus alone or phosphorus and/or boron for changing the temperature of reflow of the glass. It is only necessary then to maintain the temperature of the wafer below the reflow temperature of the particular glass 42 during and after formation of the contact apertures and through the step of contact metallization. The scope of this invention is therefore to be determined from the appended claims rather than from the preceding detailed description of preferred embodiments thereof.

What is claimed is:

1. In a process for fabricating an integrated circuit in a wafer substrate having transistors including source and drain regions, and gate oxide topped with a polycrystalline silicon layer, wherein the process includes the steps of producing a protective layer over transistor elements, a doped silicon oxide layer over the protective layer, forming contact apertures which extend through the doped silicon oxide and protective layers so as to expose source and drain regions, and depositing a metallic layer in the apertures for providing contacts to the source and drain regions, the improvement comprising:

heating the doped silicon oxide layer in a high temperature environment for a duration that is sufficient to cause densification thereof prior to said step of forming contact apertures therein, and performing all steps including and after forming the contact apertures and through depositing the metallic contact layer at a temperature that is lower than the temperature which will cause flow of the doped silicon oxide layer.

2. The process according to claim 1 wherein the temperature specified in said performing step is less than 700° C.

3. The process according to claim 1 including etching the wafer, after forming the contact apertures, in an etchant solution that will attack the doped silicon oxide layer for rounding off sharp edges on the doped silicon oxide layer at the tops of the contact apertures.

4. The process according to claim 3 wherein the etchant solution comprises hydrofluoric acid.

5. The process according to claim 3 wherein the etchant solution is a buffered solution.

6. The process according to claim 3 including the steps of agitating the wafer during said etching step and rinsing the wafer following said etching step.

7. The process according to claim 3 including the further step of rinsing the wafer immediately following said etching step.

8. The process according to claim 3 wherein the doped silicon oxide is a phosphorus doped glass.

9. The process according to claim 8 wherein the doped silicon oxide is a substantially homogeneous phosphorus doped glass.

10. The process according to claim 8 wherein the doped silicon oxide is approximately 8% phosphorus by weight.

11. The process according to claim 3 wherein the sharp edges of the glass are rounded off sufficiently to provide at least 50% step coverage during contact metallization.

12. The process according to claim 1 wherein the doped silicon oxide is a phosphorus doped glass.

13. The process according to claim 12 including etching the wafer, after forming the contact apertures, in an etchant solution that will attack the doped silicon oxide layer for rounding off sharp edges on the doped silicon oxide layer at the tops of the contact apertures.

14. The process according to claim 13 wherein the sharp edges of the glass are rounded off sufficiently to provide at least 50% step coverage during contact metallization.

15. In a process for fabricating an integrated circuit in a wafer-substrate having transistors including source and drain regions, the improvement comprising:
   depositing a layer of doped silicon oxide over the transistor elements;
   heating the doped silicon oxide layer in a high temperature environment for causing densification thereof;
   subsequently forming contact apertures in the silicon oxide layer which expose source and drain regions;
   subsequently etching the wafer in an etchant solution for rounding off sharp edges on the doped silicon oxide layer at the tops of the contact apertures; and
   subsequently depositing a metallic layer providing electrical contacts to the source and drain regions.

16. The process according to claim 15 wherein the doped silicon oxide is a phosphorus doped glass.

17. The process according to claim 16 wherein the step of and steps performed after forming the contact apertures and through the step of contact metallization are performed at a temperature and time that are less than what will cause flow of the doped silicon oxide.

18. The process according to claim 17 wherein the sharp edges of the glass are rounded off sufficiently to provide at least 50% step coverage during contact metallization.

* * * * *